US 6,992,013 B1

(12) United States Patent
Okabe et al.

(10) Patent No.: US 6,992,013 B1
(45) Date of Patent: Jan. 31, 2006

(54) METHOD OF FORMING A FINE PATTERN USING A SILICON-OXIDE-BASED FILM, SEMICONDUCTOR DEVICE WITH A SILICON-OXIDE-BASED FILM AND METHOD OF MANUFACTURE THEREOF

(75) Inventors: Ichiro Okabe, Kanagawa (JP); Hiroki Arai, Tokyo (JP)

(73) Assignees: Semiconductor Leading Edge Technologies, Inc., Kanagawa (JP); ASM Japan K.K., Tokyo (JP)

( * ) Notice: Subject to any disclaimer, the term of this patent is extended or adjusted under 35 U.S.C. 154(b) by 0 days.

(21) Appl. No.: 09/597,161

(22) Filed: Jun. 20, 2000

(30) Foreign Application Priority Data

Jun. 21, 1999 (JP) .................................. 11-174761

(51) Int. Cl.
*H01L 21/302* (2006.01)

(52) U.S. Cl. ..................... 438/723; 438/724; 438/787

(58) Field of Classification Search ........ 438/948–952, 438/705, 739, 743, 331, 317; 430/313, 317, 430/331

See application file for complete search history.

(56) References Cited

U.S. PATENT DOCUMENTS

| 5,001,083 A | * | 3/1991 | D'Anna ....................... 438/694 |
| 5,486,267 A | | 1/1996 | Knight et al. ........... 156/659.11 |
| 5,674,356 A | * | 10/1997 | Nagayama ................... 438/694 |
| 5,719,072 A | * | 2/1998 | Sugiura et al. ............. 438/671 |
| 5,783,365 A | | 7/1998 | Tsujita ........................ 430/311 |
| 5,789,141 A | | 8/1998 | Usujima ...................... 430/313 |
| 5,807,660 A | | 9/1998 | Lin et al. .................... 430/313 |
| 6,004,853 A | * | 12/1999 | Yang et al. .................. 438/305 |
| 6,093,973 A | | 7/2000 | Ngo et al. ................... 257/797 |
| 6,103,630 A | * | 8/2000 | Lee et al. .................... 438/696 |
| 6,153,504 A | * | 11/2000 | Shields et al. .............. 438/613 |
| 6,156,485 A | * | 12/2000 | Tang et al. .................. 430/313 |
| 6,171,764 B1 | * | 1/2001 | Ku et al. ..................... 430/322 |
| 6,255,717 B1 | * | 7/2001 | Babcock et al. ............ 257/640 |
| 6,429,141 B1 | * | 8/2002 | Van Ngo et al. ............ 438/723 |
| 6,586,163 B1 | * | 7/2003 | Okabe et al. ............... 430/317 |
| 6,683,010 B1 | * | 1/2004 | Lim et al. ................... 438/785 |

FOREIGN PATENT DOCUMENTS

| EP | 0 840 361 | | 5/1998 |
| JP | 08-83786 | | 3/1996 |
| JP | 08-162460 | | 6/1996 |
| JP | 10-189410 | * | 7/1998 |

(Continued)

OTHER PUBLICATIONS

Okada et al., "Furnace grown Gate Oxynitride Using Nitric Oxide (NO)", IEEE Transactions on Electron Devices, vol.: 41 Issue: 9, Sep. 1994, Page(s): 1608-1613.*

(Continued)

*Primary Examiner*—Tom Thomas
*Assistant Examiner*—José R. Díaz
(74) *Attorney, Agent, or Firm*—Foley & Lardner LLP

(57) ABSTRACT

In a method of forming a fine pattern, a silicon-oxide-based film is formed directly or by way of another layer on a substrate or on an underlying layer. The silicon-oxide-based film is formed such that nitrogen content of the surface thereof assumes a value of 0.1 atm. % or less. A chemically-amplified photoresist layer is formed on the silicon-oxide-based film. A mask pattern of a mask is transferred onto the chemically-amplified photoresist layer upon exposure through the mask. Thus, there is prevented generation of a tapered corner in a portion of a resist pattern in the vicinity of a boundary area between the resist pattern and a substrate.

5 Claims, 3 Drawing Sheets

FOREIGN PATENT DOCUMENTS

| | | |
|---|---|---|
| JP | 11-097442 | 4/1999 |
| JP | 11-317395 | 11/1999 |
| WO | 98/08143 | 2/1998 |

OTHER PUBLICATIONS

Streetman et al., Solid State Electronic Device, 2000, Prentice Hall, 5th Ed., pp. 151-155.*

Shigeyasu Mori et al., "Investigation of Substrate-Effect in Chemically Amplified Resist.", Proceedings of the SPIE-The International Society for Optical Engineering, 1996, SPIE-Int. Soc. Opt. Eng, USA; vol. 2724, pp. 131-138, XP-0009560033.

* cited by examiner

Amount of tapering=Wb−Wm

METHOD OF FORMING A FINE PATTERN USING A SILICON-OXIDE-BASED FILM, SEMICONDUCTOR DEVICE WITH A SILICON-OXIDE-BASED FILM AND METHOD OF MANUFACTURE THEREOF

BACKGROUND OF THE INVENTION

1. Field of the Invention

The present invention relates to a method of forming a fine pattern in a semiconductor device, and a method of manufacturing a semiconductor device having a fine pattern.

2. Background Art

A reduction-projection exposing technique has been widely used for fabricating a circuit pattern, such as an LSI. An improvement in resolution ascribable to a reduction in the wavelength of exposing radiation has recently been fostered in the field of exposure techniques. Resolution on the order of 0.1 μm is considered to become feasible as a result of employment of an ArF excimer laser (having a wavelength of 193 nm) in place of a KrF excimer laser (having a wavelength of 248 nm) which has been widely used. Further, use of the X-ray lithography technique or electron beam lithography technique is under study in an attempt to form a finer pattern.

Exposure using short wavelength light, X-ray, or an electron beam encounters a problem of deterioration in pattern geometry and resist sensitivity, which is caused by an absorption of light by a resist. In order to solve the problem, a chemically-amplified resist which absorbs less light and has a high sensitivity has been developed, and practical use of the chemically-amplified resist has been the subject of various studies. The studies have revealed problems hindering commercial mass-production of a chemically-amplified resist.

A typical problems pertaining to a chemically-amplified resist is an anomaly in the cross section of each of patterns formed on various underlying films. Particularly, in a case where an underlying film is a film containing nitrogen atoms, such as silicon nitride or titanium nitride, a tapered portion appearing at the foot of a chemically-amplified resist pattern poses a serious problem. A silicon nitride film has been widely used as an etching mask or an inorganic anti-reflection film. Patterning is indispensable for nitride-film-based material, and an anomaly of pattern geometry, such as a tapering pattern, must be avoided.

Such an anomaly of pattern geometry has been thought to be attributable to the phenomenon of acid being trapped by ammonium residing on the surface of a nitride film or by ammonium contaminated in the environment or being trapped by the lone pair of electrons of each nitrogen atom contained in a nitride film. A method of oxidizing the surface of a silicon nitride film through use of oxygen plasma has been proposed as described, for example, in Japanese Patent Application Laid-Open Nos. 83786/1996 and 134867/1997, and a method of depositing a silicon oxide film on a silicon nitride film has been proposed as described in Japanese Patent Application Laid-Open No. 10-189441. However, the experiments conducted by the inventor of the present invention has shown that the geometry of a resist pattern may be deteriorated even when the substrate laid immediately below a resist is subjected to the foregoing processing.

In an effort to solve such an anomaly of the geometry of a resist pattern, the present inventor has examined the cause of the anomaly. As a result, the inventor has found that in a case where a high-resolution chemically-amplified resist is adopted, the geometry of a resist pattern is deteriorated even when nitrogen atoms are present in a trace amount on the surface of a silicon oxide film. The deterioration is considered to stem from acid being trapped by the lone pair of electrons of each nitrogen atom which is present on the surface of a substrate.

It is considered that, in order to prevent nitrogen components from being contained in an oxide film, nitrogen-containing components must be eliminated from a source gas during the course of a CVD operation. For example, use of the plasma CVD technique and use of silane and oxygen as source gases are desirable. In a case where silane and oxygen are used, reaction readily proceeds at ordinary temperatures even if no plasma exists, thereby producing a fine powder of $SiO_2$ in a chamber or a process gas inlet pipe. The resultant powder leads to the presence of particles on a wafer and is not desirable.

Consequently, it is desirable that a silicon oxide film be formed in only a plasma generation area without involvement of generation of particles while using, as an oxidizing gas, $N_2O$ or NO which would induce reaction only with the assistance of energy, such as that provided by plasma.

SUMMARY OF THE INVENTION

The present invention has been conceived to solve drawbacks of the background art such as those mentioned previously. The object of the present invention is to provide a method of forming a highly-accurate fine pattern in a lithography process.

Another object of the present invention is to provide a method of forming a highly-accurate fine pattern of a silicon-oxide-based film.

Still another object of the present invention is to provide a method of forming a fine pattern which can prevent generation of a tapering portion at the foot of the resist pattern, which would otherwise arise in a boundary surface between a resist and a substrate during formation of a chemically-amplified resist pattern.

Yet another object of the present invention is to provide a method of diminishing nitrogen present on the surface of an oxide film during the course of formation of a silicon-oxide-based film.

According to one aspect of the present invention, in a method of forming a fine pattern, a silicon-oxide-based film is formed on a substrate directly or by way of another intermediate layer. The nitrogen content of the surface of the silicon-oxide-based film is made to assume a value of 0.1 atm. % or less. Then, a chemically-amplified photoresist layer is formed on the silicon-oxide-based film. Then, a mask pattern of a mask is transferred onto the chemically-amplified photoresist layer upon exposure through a mask.

In another aspect, in a method of manufacturing a semiconductor device, the underlying layer is etched byway of the fine resist pattern, to thereby form a fine pattern in the underlying layer.

According to another aspect, a semiconductor device comprises a substrate or an underlying layer, and a silicon-oxide-based film formed on the substrate or the underlying layer directly or with an intermediate layer therebetween. Further, the nitrogen content of an upper boundary area of the silicon-oxide-based film assumes a value of 0.1 atm. % or less.

Other and further objects, features and advantages of the invention will appear more fully from the following description.

DETAILED DESCRIPTION OF THE PREFERRED EMBODIMENTS

Preferred embodiments of the invention will be described hereinbelow by reference to the accompanying drawings.

First Embodiment

EXAMPLES 1–3 AND COMPARATIVE EXAMPLES 1–4)

A method of forming a fine pattern is described by reference to FIGS. 1A through 3B and Table 1.

Figure 1A:
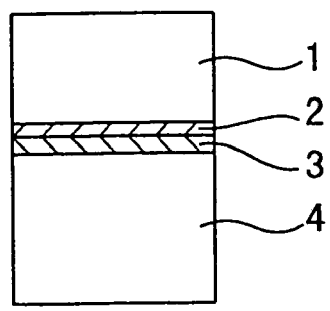
FIGS. 1A through 1C show a method of forming a fine pattern employed in a first embodiment of the present invention.
Figure 1B:
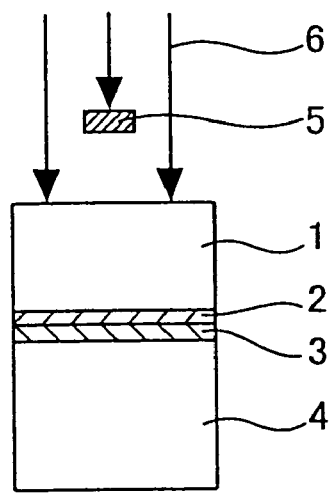
Figure 1C:
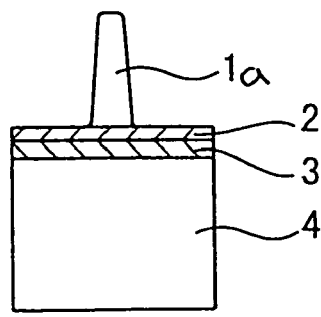

FIGS. 1A through 1C are schematic representations for describing processes of a method of forming a fine pattern employed in Examples 1 through 3 of the first embodiment and in Comparative Examples 1 through 4. Further, Table 1 provides requirements and results of the method of forming a fine pattern employed in Examples 1 through 3 and in Comparative Examples 1 through 4.

In FIG. 1, reference numeral 1 designates a photoresist; 1a designates a photoresist pattern; 2 designates an oxide silicon film; 3 designates a silicon nitride oxide film (SiON film); 4 designates a silicon substrate; 5 designates a mask to be used for exposing the photoresist 1; and 6 designates exposing radiation.

As shown FIG. 1A, under the method of forming a fine pattern according to Examples 1 through 3 and Comparative Examples 1 through 4, an SiON film 3 is deposited on the substrate 4 to a thickness of 25 nm through plasma CVD, and a silicon oxide film 2 is formed on the SiON film 3 to a thickness of 10 nm.

Table 1 shows requirements for producing silicon oxide films employed in Examples 1 through 3 and requirements for producing silicon oxide films employed in Comparative examples 1 through 4.

The present embodiment employs a parallel plate plasma enhanced CVD system (Eagle-10 by Japan ASM) and certain settings; that is, an RF frequency of 13.56 MHz, RF power of 350 W, and an internal chamber pressure of 380 Pa. Further, a prototype thermal CVD system (by TOKYO Electron) is used in the present embodiment.

The photoresist 1 was formed by means of spin coating after deposition of a silicon oxide film 2. The step of coating photoresist is as follows. A substrate having the silicon oxide film 2 formed thereon was exposed to a hexamethyldisilazane (HMDS) atmosphere at a temperature of 90° C. for 60 seconds. Subsequently, polyacryl-based positive ArF resist (AX-100, Clariant) was applied to the substrate to a thickness of 480 nm through spin-coating, and the substrate was heated on a hot plate at 115° C. for 90 seconds.

Then, as shown in FIG. 1B, the wafer was exposed to exposing radiation 6 through a mask 5 by means of a prototype ArF excimer laser stepper (by ISI), wherewith a pattern was transferred onto the wafer. The exposure system has a numerical aperture of 0.6 and a σ of 0.7.

Then, the wafer was heated on a hot plate at 110° C. for 60 seconds and developed by means of the puddle developing technique while an organic alkaline solution, such as a tetramethylammoniumhydroxydo solution, was used as a developer solution. As shown in FIG. 1C, a resist pattern (line pattern) 1a having a width of 150 nm was formed.

Observation of the thus-formed resist pattern 1a through use of a scanning electron microscope (S-5000, by Hitachi) shows a clear difference between the resist patterns formed in Examples 1 through 3 and those formed in Comparative Examples 1 through 4.

Figure 3A:
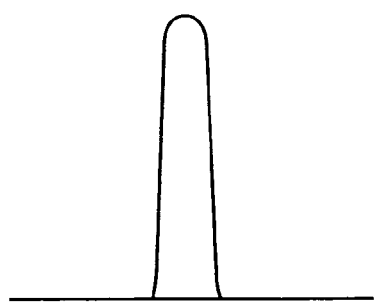
FIGS. 3A and 3B respectively show cross sections of the resist patterns in the Examples and in the Comparative Examples in the first embodiment of the present invention.
Figure 3B:
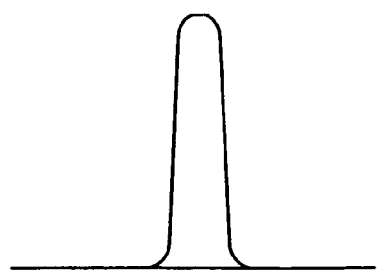

FIGS. 3A and 3B are illustrations showing a difference in cross section between the resist patterns of 150 nm width formed in Examples 1 through 4 and those formed in Comparative Examples 1 through 4. FIG. 3A shows the cross section of one of the resist patterns formed in Examples 1 through 3, and FIG. 3B shows the cross section of one of the resist patterns formed in Comparative Examples 1 through 4. The resist pattern according to Examples 1 through 3 forms a substantially-right-angle corner at the foot of the resist pattern with respect to the substrate, and it is understood that a resist pattern has been correctly formed. In contrast, the resist pattern according to Comparative Examples 1 through 4 shown in FIG. 3B forms a tapered corner or a curved corner at the foot of the resist pattern with respect to the substrate. Such a pattern is not desirable, because the dimensional accuracy of a resist pattern is deteriorated.

Figure 2:
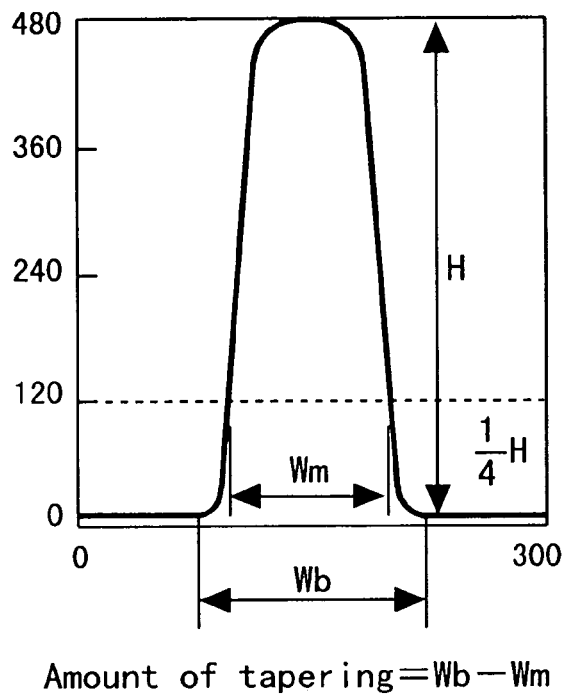
FIG. 2 shows definition of the accuracy of the resist pattern in the present invention.

The present inventor has defined the degree of a tapered corner at the foot of the resist pattern as shown in FIG. 2, thereby quantifying the accuracy of the resist pattern. As shown in FIG. 2, reference symbol Wb denotes the width of a resist line formed in the boundary surface between a resist and a substrate; and Wm denotes the width of the resist line at a position elevated H/4 from the boundary surface. Here, "H" denotes the height of the resist line. In the present embodiment, Wm denotes the width of the resist line at a position elevated 120 nm from the boundary surface. The test conducted by the present inventor shows that the dimensional accuracy of a resist pattern is not deteriorated if the degree of tapered corner, as expressed by Wb-Wm, is 20 nm or less.

Table 1 shows results of measurement of a tapered corner of a resist pattern. As is evident from Table 1, so long as the concentration of nitrogen atoms which are present on the surface of a silicon oxide film is 0.1 atm. % or less, a tapered corner of a resist pattern is found to become small. In the present embodiment, the concentration of nitrogen atoms which are contained in a silicon oxide film and nitrogen atoms which are present on the surface of a silicon oxide film were measured through use of the Secondary Ion Mass Spectroscopy (SIMS) technique.

TABLE 1

| | DEPOSITION METHOD | SOURCE GAS | REACTION TEMPERATURE (° C.) | NITROGEN CONTENT IN THE SURFACE OF A SILICON OXIDE FILM (atm. %) | DEGREE OF TAPERED CORNER (nm) |
|---|---|---|---|---|---|
| EXAMPLE 1 | THERMAL CVD TECHNIQUE | $SiH_4$, $N_2O$ | 800 | 0.08 | 12 |
| EXAMPLE 2 | PLASMA CVD TECHNIQUE | $SiH_4$, $N_2O$ | 500 | 0.02 | 9 |
| EXAMPLE 3 | THERMAL CVD TECHNIQUE | TEOS | 750 | 0.00 | 14 |
| COMPARATIVE EXAMPLE 1 | THERMAL CVD TECHNIQUE | $SiH_2Cl_2$, $N_2O$ | 740 | 0.30 | 26 |
| COMPARATIVE EXAMPLE 2 | PLASMA CVD TECHNIQUE | $SiH_4$, $N_2O$ | 250 | 1.00 | 60 |
| COMPARATIVE EXAMPLE 3 | PLASMA CVD TECHNIQUE | $SiH_4$, $N_2O$ | 300 | 0.30 | 54 |
| COMPARATIVE EXAMPLE 4 | PLASMA CVD TECHNIQUE | $SiH_4$, $N_2O$ | 350 | 0.14 | 38 |

Although in the present embodiment ArF excimer laser reduction exposure has been used for transferring a mask pattern through exposure, another exposure technique may be employed. For example, there may be employed an X-ray exposure technique, a KrF excimer laser contact exposure or reduction projection exposure technique, an $F_2$ excimer laser contact exposure or reduction projection exposure technique, a step-and-scan reflection-type reduction projection exposure technique using UV radiation as the light source, or a soft-X-ray exposure technique. Further, the value of numerical aperture and the value of σ are not limited to those described previously. A pattern to be exposed is not limited to a line pattern, and a hole pattern or a dot pattern may also be used as an object of exposure.

In Examples 1 through 3 and in Comparative Examples 1 through 4, a wafer was exposed to an HMDS atmosphere immediately before coating with a resist film, thus forming a contacting layer. In a case where a resist film is in sufficient contact with a substrate, formation of a contacting layer may be omitted.

In the present embodiment, an silicon oxynitride film is deposited immediately beneath a silicon oxide film. However, a silicon nitride film may be deposited immediately beneath the silicon oxide film. Alternatively, the silicon oxide nitride film or the silicon nitride film may not be deposited.

In the present embodiment, silane was used as a source gas. However, there may be used any gas containing silicon; for example, $Si_2H_6$, $SiH_3(CH_3)$, $SiH_2(CH_3)_{21}$ $SiCl_2H_2$' $SiCl_4$, or $SiH(CH_3)_3$.

$N_2O$ was used as another source gas in Examples 1 through 3 and in Comparative Examples 1 through 4. However, there may be used any oxidizing gas; for example, NO or CO.

Although a parallel plate plasma enhanced CVD system was used in Examples 1 through 3 and in Comparative Examples 1 through 4, an ECR plasma CVD system or a bias ECR plasma CVD system may be used.

Various modifications, improvements, or combinations of the present invention will be evident to one versed in the art.

Further, in the processes for manufacturing a semiconductor device, after a fine resist pattern 1a has been formed as shown in FIG. 1C, the underlying silicon oxide film 2 or the silicon oxide film 2 and the SiON film 3 are etched by way of the resist pattern 1a, thereby forming a fine pattern from an insulating film. In a case where a substrate is formed from a conductive film, a fine pattern can be formed from a conductive film. A semiconductor device can be manufactured through succeeding manufacturing processes, and explanation of manufacture of a semiconductor device is omitted.

In the present embodiment, a semiconductor device having a pattern on the order of 0.1 μm can be fabricated, and the present invention can be usually preferably applied to formation of a pattern of 0.18 μm or less.

As mentioned previously, according to the present embodiment, a silicon-oxide-based film whose surface has a nitrogen content of 0.1 atm. % or less is formed, and a chemically-amplified photoresist is formed on the silicon-oxide-based film, thus constituting a resist pattern.

Thus, deterioration in pattern geometry of the boundary surface between the photoresist and the substrate, which would otherwise be caused in the course of formation of a chemically-amplified resist pattern, is prevented, wherewith a highly-accurate fine resist pattern can be formed. Further, a finer and more-accurate pattern of an insulating or conductive film can be formed, which in turn enables fabrication of a semiconductor device having such a fine pattern.

Second Embodiment

EXAMPLES 4–8 AND COMPARATIVE EXAMPLES 5–7

Examples 4 through 8 and Comparative Examples 5 through 7 according to a second embodiment of the present invention will now be described by reference to FIGS. 4A through 4C and Table 2.

Figure 4A:
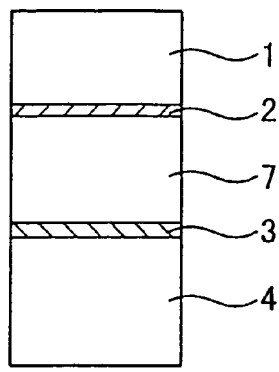
FIGS. 4A through 4C show a method of forming a fine pattern employed in a second embodiment of the present invention.
Figure 4B:
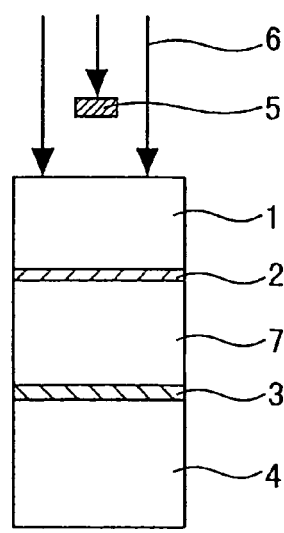
Figure 4C:
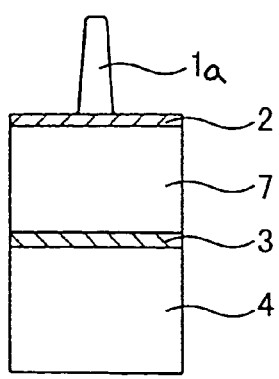

FIGS. 4A through 4C are schematic representations for describing processes for forming a fine pattern, the processes being employed in Examples 4 through 8 and Comparative Examples 5 through 7. Table 2 provides requirements and results of the method of forming a fine pattern employed in Examples 4 through 8 and in Comparative Examples 5 through 7.

In FIGS. 4A through 4C, reference numerals 1 through 6 and 1a are identical with those employed in FIG. 1 pertaining to the first embodiment, and hence repetition of their explanations is omitted. Here, reference numeral 7 designates a BPSG film;

As shown in FIG. 4A, according to a method of forming a fine pattern, which is employed in Examples 4 through 8 and Comparative Examples 5 through 7 in connection with the present embodiment, a SiON film 3 is deposited to a thickness of 25 nm on the substrate 4 by means of the plasma CVD technique, and a BPSG film 7 was formed on the SiON film 3 to a thickness of 700 nm by means of the atmospheric pressure CVD technique. Subsequently, a silicon oxide film 2 was deposited on the BPSG film 7 to a thickness of 10 nm by means of the plasma CVD technique. The present embodiment employed a prototype plasma CVD system (of a parallel plate plasma enhanced CVD type, manufactured by Japan ASM).

In Examples 4 through 8 and in Comparative Examples 5 through 7, requirements for forming a silicon oxide film are changed, as shown in Table 2.

After deposition of a silicon oxide film 2, the silicon oxide film was coated with the photoresist 1. A process of coating a silicon oxide film with photoresist will now be described in detail. First, a substrate having the silicon oxide film 2 formed thereon was exposed to a hexamethyldisilazane (HMDS) atmosphere at a temperature of 90° C. for 60 seconds. Subsequently, polyacryl-based positive ArF resist (PAR-101, by Sumitomo Chemical) was applied to the substrate to a thickness of 480 nm through spin-coating, and the substrate was heated on a hot plate at 120° C. for 60 seconds.

As shown in FIG. 4B, the wafer was exposed to exposing radiation 6 through a mask 5 and by means of a prototype ArF excimer laser stepper (by ISI), wherewith a pattern was transferred onto the wafer. An exposure system has a numerical aperture of 0.6 and a σ of 0.7.

The wafer was heated on a hot plate at 120° C. for 60 seconds and developed by means of the puddle developing technique while an organic alkaline solution, such as a tetramethylammoniumhydroxydo solution, was used as a developer solution. As shown in FIG. 4C, a resist pattern (line pattern) 1$a$ having a width of 150 nm was formed.

Observation of the thus-formed resist pattern 1$a$ through use of a scanning electron microscope (S-5000, by Hitachi) shows a clear difference between the resist patterns formed in Examples 4 through 8 and those formed in Comparative Examples 5 through 7.

As mentioned previously, FIGS. 3A and 3B are illustrations showing a difference in cross section between the resist patterns of 150 nm width formed in Examples 1 through 8 and those formed in Comparative Examples 1 through 7.

The resist pattern according to Examples 4 through 8 forms a substantially-right-angle corner with respect to the substrate in the vicinity of the area between the substrate and the resist pattern as shown in FIG. 3A, and it is understood that a resist pattern has been correctly formed. In contrast, the resist pattern according to Comparative Examples 5 through 7 forms a tapered corner with respect to the substrate as shown in FIG. 3B. Such a pattern having a tapered corner is not desirable, because the dimensional accuracy of a resist pattern is deteriorated.

The degree of a tapered corner of each of the resist patterns formed in respective Examples 4 through 8 and the resist patterns formed in respective Comparative Examples 5 through 8 is qualified through use of the definition illustrated in FIG. 2. Qualification results are shown in Table 2. From the results, it is understood that setting a reaction temperature required in the plasma CVD process to a temperature of 400° C. or more reduces nitrogen content of the surface of a silicon oxide film to 0.1 atm. %, and a tapered corner of the resist pattern can be diminished to 20 nm or less.

Although in the present embodiment ArF excimer laser reduction exposure has been used for transferring a mask pattern through exposure, another exposure technique may be employed. For example, there may be employed an X-ray exposure technique, a KrF excimer laser contact exposure or reduction projection exposure technique, an $F_2$ excimer laser contact exposure or reduction projection exposure technique, a step-and-scan reflection-type reduction projection exposure technique using UV radiation as the light source, or a soft-X-ray exposure technique. Further, the value of numerical aperture and the value of σ are not limited to those described previously. A pattern to be exposed is not limited to a line pattern, and a hole pattern or a dot pattern may also be used as an object of exposure.

In Examples 4 through 8 and in Comparative Examples 5 through 7, a wafer was exposed to an HMDS atmosphere immediately before coating with a resist film, thus forming a contacting layer. In a case where a resist film is in sufficient contact with a substrate, formation of a contacting layer may be omitted.

In the present embodiment, the BPSG film 7 and the silicon oxynitride film 3 are deposited immediately beneath the silicon oxide film 2. However, these layers may be replaced with another material; for example, a BPSG film or a TEOS film. Further, the SiON film may be replaced with a silicon-oxide-based film, or such layer may not be deposited.

Although in the present embodiment a parallel plate plasma enhanced CVD system was used in Examples 4 through 8 and in Comparative Examples 4 through 7, an ECR plasma CVD system or a bias ECR plasma CVD system may be used.

In the present embodiment, silane was used as a source gas. However, there may be used any gas containing silicon; for example, $Si_2H_6$, $SiH_3(CH_3)$, $SiH_2(CH_3)_2$, $SiCl_2H_2$, $SiCl_4$, or $SiH(CH_3)_3$.

$N_2O$ was used as another source gas in Examples 4 through 8. However, there may be used any oxidizing gas; for example, NO or CO.

Various modifications, improvements, or combinations of the present embodiment will be evident to one versed in the art.

TABLE 2

| | DEPOSITION METHOD | SOURCE GAS | REACTION TEMPERATURE (° C.) | NITROGEN CONTENT IN THE SURFACE OF A SILICON OXIDE FILM (atm. %) | DEGREE OF TAPERED CORNER (nm) |
| --- | --- | --- | --- | --- | --- |
| EXAMPLE 4 | THERMAL CVD TECHNIQUE | $SiH_4$, $N_2O$ | 400 | 0.1 | 18 |
| EXAMPLE 5 | PLASMA CVD TECHNIQUE | $SiH_4$, $N_2O$ | 450 | 0.08 | 9 |
| EXAMPLE 6 | PLASMA CVD TECHNIQUE | $SiH_4$, $N_2O$ | 500 | 0.02 | 17 |

TABLE 2-continued

| | DEPOSITION METHOD | SOURCE GAS | REACTION TEMPERATURE (° C.) | NITROGEN CONTENT IN THE SURFACE OF A SILICON OXIDE FILM (atm. %) | DEGREE OF TAPERED CORNER (nm) |
|---|---|---|---|---|---|
| EXAMPLE 7 | PLASMA CVD TECHNIQUE | SiH$_4$, N$_2$O | 600 | 0.03 | 12 |
| EXAMPLE 8 | PLASMA CVD TECHNIQUE | SiH$_4$, N$_2$O | 700 | 0.01 | 10 |
| COMPARATIVE EXAMPLE 5 | PLASMA CVD TECHNIQUE | SiH$_4$, N$_2$O | 200 | 0.40 | 50 |
| COMPARATIVE EXAMPLE 6 | PLASMA CVD TECHNIQUE | SiH$_4$, N$_2$O | 300 | 0.32 | 34 |
| COMPARATIVE EXAMPLE 7 | PLASMA CVD TECHNIQUE | SiH$_4$, N$_2$O | 360 | 0.16 | 40 |

As mentioned previously, according to the present embodiment, a silicon-oxide-based film whose surface has a nitrogen content of 0.1 atm. % or less is formed by means of setting a reaction temperature employed in the plasma CVD process to a value of 400° C. or more, and a chemically-amplified photoresist is formed on the silicon-oxide-based film, thus constituting a resist pattern.

Thus, deterioration in pattern geometry of the boundary surface between the photoresist and the substrate, which would otherwise be caused in the course of formation of a chemically-amplified resist pattern, is prevented, wherewith a highly-accurate minute resist pattern can be formed. Further, a finer and more-accurate pattern of an insulating or conductive film can be formed, which in turn enables fabrication of a semiconductor device having such a fine pattern.

Third Embodiment

EXAMPLES 9–14, AND COMPARATIVE EXAMPLES 8–10

Examples 9 through 14 according to a third embodiment of the present invention will now be described in comparison with Comparative Examples 8 through 10, through use of FIGS. 1A through 1C and Table 3.

FIGS. 1A through 1C are schematic representations for describing processes of a method of forming a fine pattern employed in Examples 9 through 14 of the third embodiment and in Comparative Examples 8 through 10. Further, Table 3 provides requirements and results of the method of forming a fine pattern employed in Examples 9 through 14 and Comparative Examples 8 through 10. Since FIGS. 1A through 1C have already been described in connection with the first embodiment, repetition of their explanations is omitted here.

The method of forming a fine pattern employed in Examples 9 through 14 and in Comparative Examples 8 through 10 according to the present embodiment is identical with that employed in Examples 1 through 3 and in Comparative Examples 1 through 4 according to the first embodiment. Here, Examples 9 through 14 are characterized by inserting, into the processes, a step of exposing the surface of a silicon oxide film to oxygen plasma or N$_2$O plasma after formation of the silicon oxide film. Further, Comparative Examples 8 through 10 are characterized by means of omission, from the processes, of the step of exposing a silicon oxide film to plasma.

In Examples 9 through 14 and in Comparative Examples 8 through 10, the SiON film 3 shown in FIG. 1 assumes a thickness of 100 nm, and the silicon oxide film 2 assumes a thickness of 30 nm. The present embodiment employed a plasma CVD system (Eagle-10, by Japan ASM) and certain settings: an RF frequency of 13.56 MHz; an RF power of 400 W, and an internal chamber pressure of 400 Pa.

In Examples 9 through 14 and in Comparative Examples 8 through 10, the requirements for forming a silicon oxide film and requirements for processing the surface of a silicon oxide film were changed, as shown in Table 3.

After formation of a silicon oxide film, the surface of the silicon oxide film was subjected to treatment within the chamber that has been employed in the process of forming the silicon oxide film. More specifically, after completion of the process of forming a silicon oxide film, the gas to be introduced was changed to solely O$_2$ or N$_2$O, and the processing operation was carried out continuously for about 60 seconds. At this time, a flow rate of N$_2$O or O$_2$ was set to 1500 sccm, and the internal pressure of the chamber was set to 400 Pa.

After deposition of a silicon oxide film, the silicon oxide film was coated with the photoresist 1. A process of coating a silicon oxide film with photoresist will now be described in detail. First, a substrate having the silicon oxide film 2 formed thereon was exposed to a hexamethyldisilazane (HMDS) atmosphere at a temperature of 90° for 60 seconds. Subsequently, a polynolbornane-based positive ArF resist (by Shinetsu Chemical) was applied to the substrate to a thickness of 480 nm through spin-coating, and the substrate was heated on a hot plate at 130° C. for 60 seconds.

As shown in FIG. 1B, the wafer was exposed to exposing radiation 6 through a mask 5 and by means of a prototype ArF excimer laser stepper (NSR-S302A, by Nikon), wherewith a pattern was transferred onto the wafer. An exposure system has a numerical aperture of 0.6 and a σ of 0.7. The wafer was heated on a hot plate at 110° C. for 60 seconds and developed by means of the puddle developing technique while an organic alkaline solution, such as a tetramethylammoniumhydroxydo solution, was used as a developer solution. As shown in FIG. 1C, a resist pattern (line pattern) 1a having a width of 150 nm was formed.

The thus-formed resist pattern 1a was observed through use of a scanning electron microscope (S-5000, by Hitachi), and the degree of a tapered corner of a resist pattern was quantified through use of the definition illustrated in FIG. 2. Table 3 shows observation results. A nitrogen content of the surface of a silicon oxide film was diminished by means of the wafer being subjected to a plasma atmosphere of oxidizing gas of O$_2$ or N$_2$O, wherewith the degree of a tapered corner could be diminished. Control of pattern geometry has been further improved as a result of a reduction in the degree of a tapered corner of the photoresist.

Although in the present embodiment ArF excimer laser reduction exposure has been used for transferring a resist pattern through exposure, another exposure technique may be employed. For example, there may be employed an X-ray exposure technique, a KrF excimer laser contact exposure or reduction projection exposure technique, an $F_2$ excimer laser contact exposure or reduction projection exposure technique, a step-and-scan reflection-type reduction projection exposure technique using UV radiation as the light source, or a soft X-ray exposure technique. Further, the value of numerical aperture and the value of a are not limited to those described previously. A pattern to be exposed is not limited to a line pattern, and a hole pattern or a dot pattern may also be used as an object of exposure.

In Examples 9 through 14, a wafer was exposed to an HMDS atmosphere immediately before coating with a resist film, thus forming a contact layer. In a case where a resist film is in sufficient contact with a substrate, formation of a contact layer may be omitted.

In the present embodiment, a silicon oxynitride film is deposited immediately beneath a silicon oxide film. However, a silicon nitride film may be deposited in place of a silicon oxynitride film. Further, deposition of a silicon oxynitride film may not be required.

Although in the present embodiment a parallel plate plasma enhanced CVD system was used in Examples 9 through 14, an ECR plasma CVD system or a bias ECR plasma CVD system may be used.

Further, although in the present embodiment a parallel plate plasma enhanced CVD system was used for treating the surface of a silicon oxide film, an ECR plasma etching system or an asher may also be employed.

Although in the present embodiment $N_2O$ and $O_2$ were used for treating the surface of a silicon oxide film, any oxidizing gas, such as CO or NO, can be employed.

In the present embodiment, silane was used as a source gas. However, there may be used any gas containing silicon; for example, $Si_2H_6$, $SiH_3(CH_3)$, $SiH_2(CH_3)_2$, $SiCl_2H_2$, $SiCl_4$, or $SiH(CH_3)_3$.

Various modifications, improvements, or combinations of the present embodiment will be evident to one versed in the art.

As mentioned previously, according to the present embodiment, a silicon-oxide-based film whose surface has a nitrogen content of 0.1 atm. % or less is formed, and the surface of the silicon-oxide-based film is exposed to plasma atmosphere of oxidizing gas, such as oxygen or $N_2O$, after formation of the silicon-oxide-based film, to thereby diminish the nitrogen content of the surface of the silicon oxide film. A chemically-amplified photoresist is applied to the silicon oxide film by means of coating, thus forming a resist pattern.

Thus, deterioration in pattern geometry of the boundary surface between the photoresist and the substrate, which would otherwise be caused in the course of formation of a chemically-amplified resist pattern, is prevented, wherewith a highly-accurate minute resist pattern can be formed. Further, a finer and more-accurate pattern of an insulating or conductive film can be formed, which in turn enables fabrication of a semiconductor device having such a fine pattern.

In the above embodiments, it is so described that a silicon-oxide-based film is formed on a substrate. However, in the present invention, the silicon-oxide-based film may be formed directly or indirectly on an underlying layer, and a fine pattern is ultimately formed in the underlying layer through a fine resist pattern.

The features and the advantages of the present invention as embodied above may be summarized as follows.

According to one aspect, in a method of forming a fine pattern, a silicon-oxide-based film is directly formed on a substrate or by way of another layer on a substrate. A chemically-amplified photoresist is formed on the silicon-oxide-based film. A mask pattern is transferred onto the chemically-amplified photoresist upon exposure through a mask. Further, nitrogen content of the surface of the silicon-oxide-based film is made to assume a value of 0.1 atm. % or less. Therefore, a highly-accurate fine pattern can be formed in a lithography step.

Preferably, plasma CVD is employed during the course of the step of depositing the silicon-oxide-based film, and the silicon-oxide-based film is formed while the temperature at

TABLE 3

| | METHOD FOR DEPOSITING SILICON OXIDE FILM | SOURCE GAS | REACTION TEMPERATURE (° C.) | SURFACE TREATMENT OF SILICON OXIDE FILM | NITROGEN CONTENT IN THE SURFACE OF A SILICON OXIDE FILM (atm. %) | DEGREE OF TAPERED CORNER (nm) |
|---|---|---|---|---|---|---|
| EXAMPLE 9 | THERMAL D CHNIQUE | $SiH_2Cl_2$, $N_2O$ | 800 | $N_2O$ PLASMA | 0.06 | 12 |
| EXAMPLE 10 | THERMAL CVD TECHNIQUE | $SiH_2Cl_2$, $N_2O$ | 800 | $O_2$ PLASMA | 0.08 | 14 |
| COMPARATIVE EXAMPLE 8 | THERMAL CVD TECHNIQUE | $SiH_2Cl_2$, $N_2O$ | 800 | NONE | 0.15 | 22 |
| EXAMPLE 11 | PLASMA CVD TECHNIQUE | $SiH_4$, $N_2O$ | 300 | $N_2O$ PLASMA | 0.05 | 18 |
| EXAMPLE 12 | PLASMA CVD TECHNIQUE | $SiH_4$, $N_2O$ | 300 | $O_2$ PLASMA | 0.09 | 20 |
| COMPARATIVE EXAMPLE 9 | PLASMA CVD TECHNIQUE | $SiH_4$, $N_2O$ | 300 | NONE | 0.25 | 50 |
| EXAMPLE 13 | PLASMA CVD TECHNIQUE | $SiH_4$, $N_2O$ | 500 | $N_2O$ PLASMA | 0.01 | 8 |
| EXAMPLE 14 | PLASMA CVD TECHNIQUE | $SiH_4$, $N_2O$ | 500 | $O_2$ PLASMA | 0.03 | 10 |
| COMPARATIVE EXAMPLE 10 | PLASMA CVD TECHNIQUE | $SiH_4$, $N_2O$ | 500 | NONE | 0.07 | 18 | which the substrate is to be disposed is set to 400° C. or more. Accordingly, nitrogen atoms contained in a silicon oxide film and those contained in the surface of the silicon oxide film can be reduced in amount. Deterioration in geometry of a resist pattern is prevented, thus enabling formation of a highly-accurate fine pattern.

In another aspect, a step of exposing the surface of the silicon oxide film to plasma atmosphere of $O_2$ or $N_2O$ is added so as to follow the step of depositing the silicon-oxide-based film, whereby nitrogen content of the surface of the silicon oxide film can be diminished. Therefore, deterioration in geometry of a resist pattern is prevented, thus enabling formation of a highly-accurate fine pattern.

In another aspect, a highly-accurate fine insulating or conductive pattern can be formed, and a semiconductor device having such a fine pattern can be fabricated.

It is further understood that the foregoing description is a preferred embodiment of the disclosed device and that various changes and modifications may be made in the invention without departing from the spirit and scope thereof.

The entire disclosure of a Japanese Patent Application No. 11-174761, filed on Jun. 21, 1999 including specification, claims, drawings and summary, are incorporated herein by reference in its entirety.

What is claimed is:

1. A method of forming a fine pattern comprising the steps of:

forming a silicon-oxide-based film over a substrate by using $SiH_4$ and $N_2O$ as material gases at a reaction temperature of over 400° C., wherein, in the step of forming the silicon-oxide-based film, a nitrogen content of a surface of the silicon-oxide-based film is made to about a value of 0.01 atm % to 0.08 atm %;

forming a chemically-amplified photoresist layer on the silicon-oxide-based film;

transferring a mask pattern onto the chemically-amplified photoresist layer upon exposure through a mask; and exposing the surface of the silicon-oxide-based film to plasma atmosphere of $O_2$ or $N_2O$ between the step of forming the silicon-oxide-based film and the step of forming the chemically-amplified photoresist layer.

2. The method of forming a fine pattern according to claim 1, wherein the silicon-oxide-based film is deposited by means of a plasma CVD technique.

3. The method of forming a fine pattern according to claim 1, wherein the silicon-oxide-based film is formed at a reaction temperature of 450° C. or more.

4. A method of manufacturing a semiconductor device, comprising the steps of:

forming a silicon-oxide-based film over an underlying layer, wherein the silicon-oxide-based film is formed by using $SiH_4$ and $N_2O$ as material gases at a reaction temperature of over 400° C. such that a surface of the silicon-oxide-based film has a nitrogen content of about 0.01 atm % to 0.08 atm %:

exposing a surface of the silicon-oxide-based film to plasma atmosphere of $O_2$ or $N_2O$;

forming a chemically-amplified photoresist layer on the silicon-oxide-based film;

transferring a mask pattern onto the chemically-amplified photoresist layer upon exposure through a mask; and etching the underlying layer by way of a resist pattern, to thereby form a fine pattern in the underlying layer.

5. The method of manufacturing a semiconductor device according to claim 4, wherein the silicon-oxide-based film is formed at a reaction temperature of 450° C. or more.

* * * * *

UNITED STATES PATENT AND TRADEMARK OFFICE
CERTIFICATE OF CORRECTION

PATENT NO. : 6,992,013 B1
APPLICATION NO. : 09/597161
DATED : January 31, 2006
INVENTOR(S) : Ichiro Okabe and Hiroki Arai It is certified that error appears in the above-identified patent and that said Letters Patent is hereby corrected as shown below:

Title page,
Item [73], Assignee, delete "Semiconductor Leading Edge Technologies, Inc." and replace it with -- Sharp Kabushiki Kaisha --.

Signed and Sealed this

Fourth Day of July, 2006

JON W. DUDAS
*Director of the United States Patent and Trademark Office*